US009978596B2

(12) United States Patent
Zhang et al.

(10) Patent No.: US 9,978,596 B2
(45) Date of Patent: May 22, 2018

(54) SELF-ALIGNED MULTIPLE SPACER PATTERNING SCHEMES FOR ADVANCED NANOMETER TECHNOLOGY

(71) Applicant: Applied Materials, Inc., Santa Clara, CA (US)

(72) Inventors: Ying Zhang, Santa Clara, CA (US); Uday Mitra, Cupertino, CA (US); Praburam Gopalraja, San Jose, CA (US); Srinivas D. Nemani, Sunnyvale, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/377,629

(22) Filed: Dec. 13, 2016

(65) Prior Publication Data
US 2017/0092494 A1    Mar. 30, 2017

Related U.S. Application Data

(63) Continuation of application No. 14/730,194, filed on Jun. 3, 2015, now Pat. No. 9,548,201.

(60) Provisional application No. 62/015,227, filed on Jun. 20, 2014.

(51) Int. Cl.
| | |
|---|---|
| *H01L 21/302* | (2006.01) |
| *H01L 21/461* | (2006.01) |
| *H01L 21/033* | (2006.01) |
| *H01L 21/311* | (2006.01) |
| *H01L 21/768* | (2006.01) |

(52) U.S. Cl.
CPC ...... *H01L 21/0332* (2013.01); *H01L 21/0337* (2013.01); *H01L 21/31116* (2013.01); *H01L 21/31144* (2013.01); *H01L 21/76816* (2013.01)

(58) Field of Classification Search
CPC ........... H01L 21/76897; H01L 21/0337; H01L 21/31144; H01L 21/0338; H01L 21/76811; H01L 21/266; H01L 21/0273; H01L 21/28123; H01L 21/0274
USPC ........ 257/629, 635, 637, 797; 438/736, 737, 438/689, 694, 706
See application file for complete search history.

(56) References Cited

U.S. PATENT DOCUMENTS

| | | | | |
|---|---|---|---|---|
| 7,935,639 | B2* | 5/2011 | Li | H01L 21/3081 257/E21.035 |
| 8,338,304 | B2* | 12/2012 | Zhou | H01L 21/0338 257/618 |
| 9,177,820 | B2 | 11/2015 | Bergendahl et al. | |
| 2007/0077524 | A1 | 4/2007 | Koh et al. | |
| 2010/0258913 | A1* | 10/2010 | Lue | H01L 21/0337 257/618 |
| 2014/0170853 | A1 | 6/2014 | Shamma et al. | |

(Continued)

*Primary Examiner* — Hsien Ming Lee
(74) *Attorney, Agent, or Firm* — Patterson + Sheridan LLP

(57) ABSTRACT

The present disclosure provides forming nanostructures with precision dimension control and minimum lithographic related errors for features with dimension under 14 nanometers and beyond. A self-aligned multiple spacer patterning (SAMSP) process is provided herein and the process utilizes minimum lithographic exposure process, but rather multiple deposition/etching process to incrementally reduce feature sizes formed in the mask along the manufacturing process, until a desired extreme small dimension nanostructures are formed in a mask layer.

7 Claims, 8 Drawing Sheets

(56) References Cited

U.S. PATENT DOCUMENTS

2015/0151329 A1* 6/2015 Kawanishi ............ G03F 7/0002
  427/553
2015/0155176 A1 6/2015 Mignot et al.

* cited by examiner

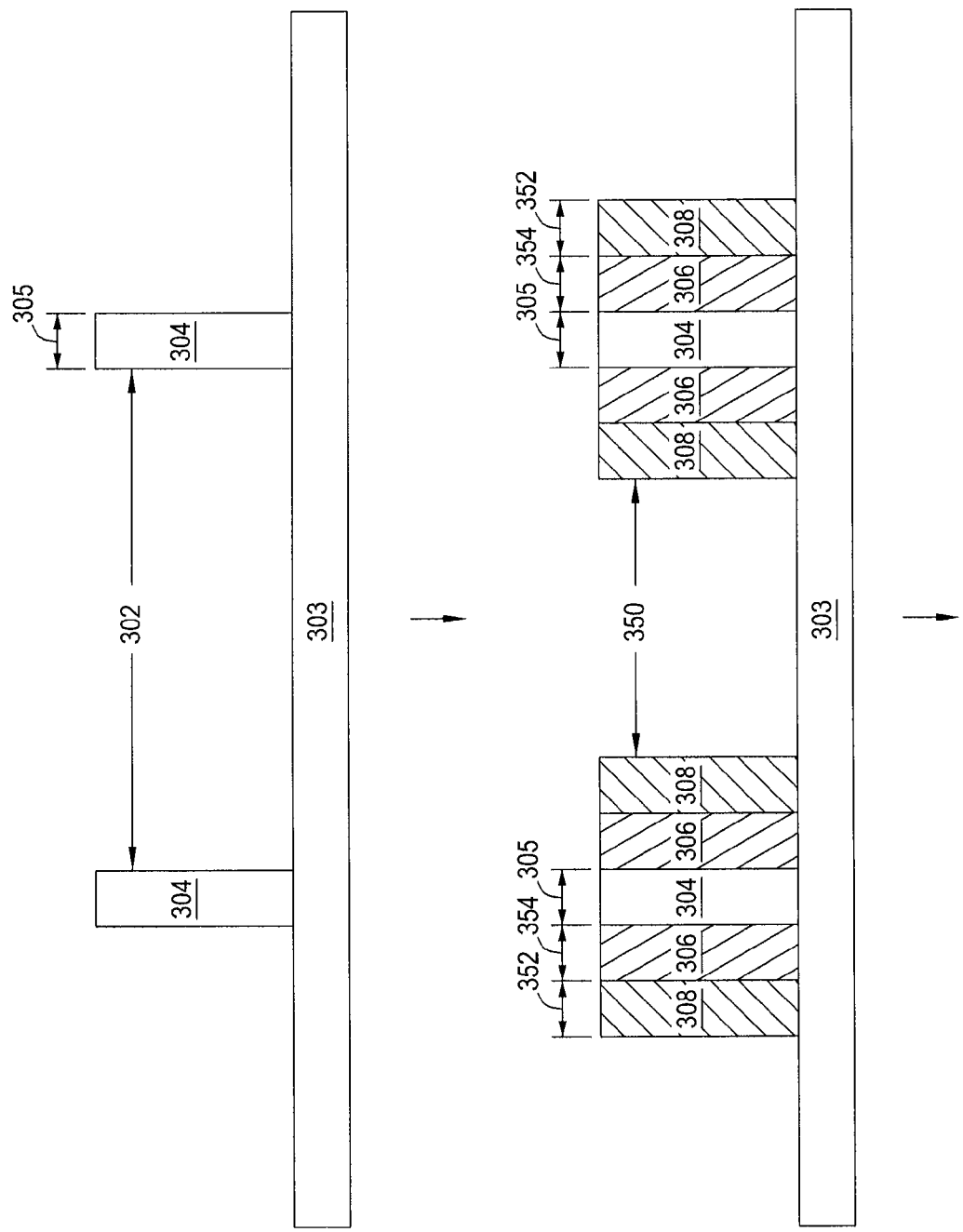

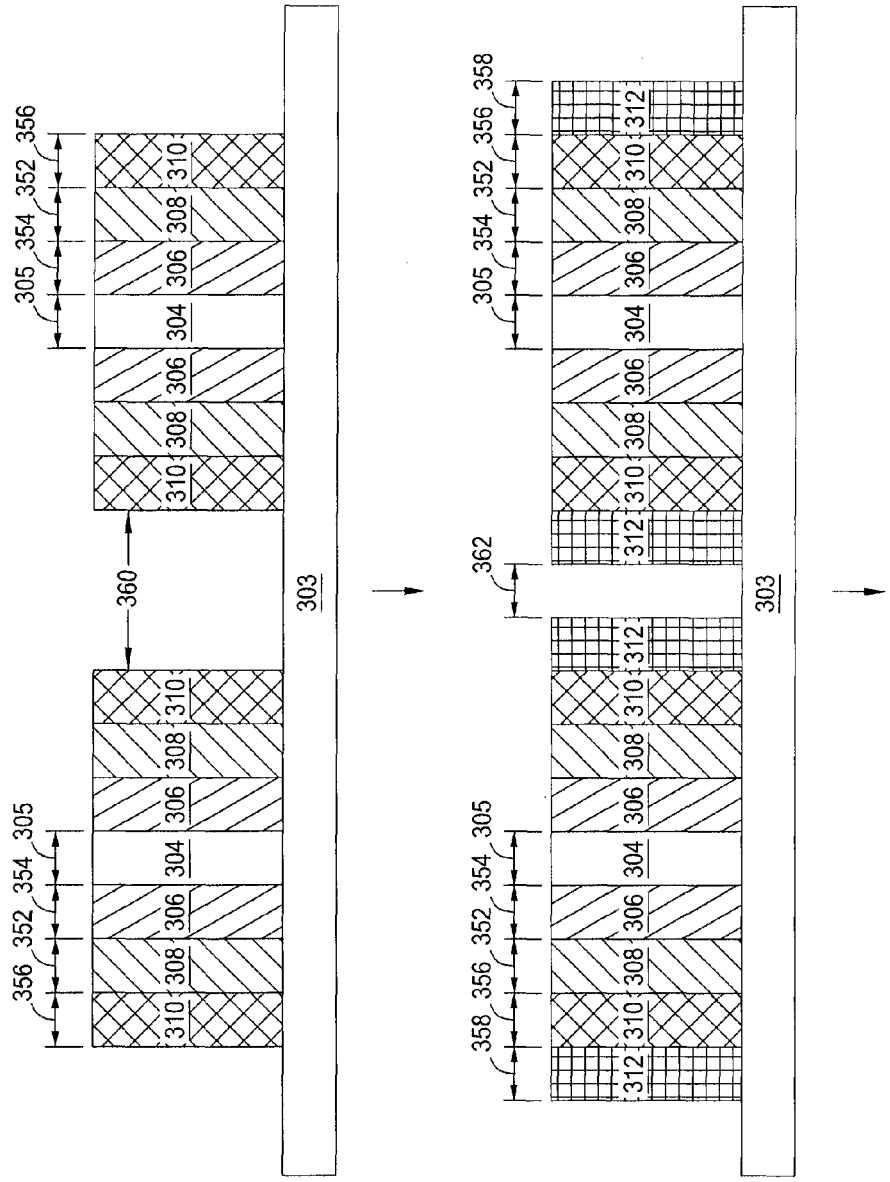

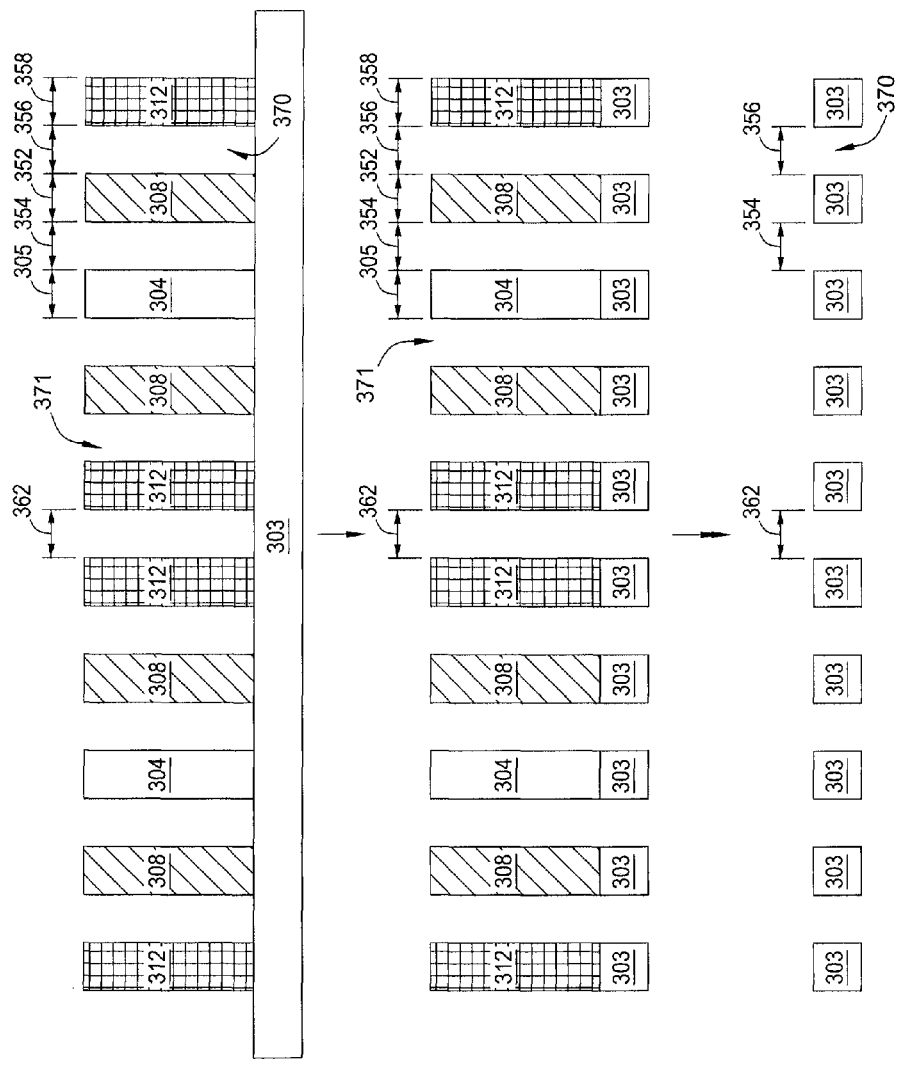

SELF-ALIGNED MULTIPLE SPACER PATTERNING SCHEMES FOR ADVANCED NANOMETER TECHNOLOGY

CROSS-REFERENCE TO OTHER APPLICATIONS

This application is a continuation of U.S. patent application Ser. No. 14/730,194, entitled "Self-Aligned Multiple Spacer Patterning Schemes For Advanced Nanometer Technology", filed Jun. 3, 2015, which claims benefit of U.S. Provisional Application Ser. No. 62/015,227 filed Jun. 20, 2014, which is incorporated by reference in its entirety.

BACKGROUND

Field

Examples of the present disclosure generally relate to forming nanostructures in a film layer. Particularly, embodiments of the present disclosure provide methods for forming nanostructures with precision dimension control and minimum lithographic related errors Description of the Related Art In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. The images of the patterned mask are projected through the high-precision optical system onto the substrate surface, which is coated with a layer of photoresist layer. The patterns are then formed on the substrate surface after complex chemical reactions and follow-on manufacturing steps, such as development, post-exposure bake and wet or dry etching.

Multiple patterning technique is a technology developed for photolithography to enhance the feature density. A simple example for utilizing the multiple patterning technique is double patterning, where a conventional lithography process is enhanced to produce double the expected number of features. Double exposure is a sequence of two separate exposures of the same photoresist layer using two different photomasks. This technique is commonly used for patterns in the same layer which look very different or have incompatible densities or pitches.

Double patterning lithography (DPL) is an effective technique to improve resolution. DPL theoretically doubles resolution through pitch splitting. DPL involves two separate exposures and etch steps (litho-etch-litho-etch, or called LELE or L2E2). DPL is particularly suitable for 20 nm generation technology and is one of the promising candidate solutions for scaling down to 14 nm technology and beyond. In some structures that require feature pitch down under 10 nm, higher number of the patterning technique, such as quadruple patterning or octuple patterning (L4E4 or L8E8), may be required to push the dimension limit. However, the lithography exposure process is an expensive process. Multiple practices of the lithography exposure processes for just a single layer patterning not only time consuming, but also significantly increase manufacturing cost. Furthermore, as well known in the art, overlay errors (or pattern registration errors) between layers are often inevitable during the lithographic exposure process. Thus, multiple exposure process on a single layer may enhance undesired overlay errors that may be detriment to device performance. With the shrink of critical dimensions (CD), overlay error in the critical layers of the device structure must be minimal or eliminated in order to reliably produce devices with minimal feature sizes.

Therefore, there is a need for forming nanostructures with precision dimension control and minimum lithographic related errors.

SUMMARY

The present disclosure provides forming nanostructures with precision dimension control and minimum lithographic related errors for features with dimensions under 14 nanometers and beyond. In one embodiment, an interconnection structure includes a material layer disposed on a substrate, a first patterned mask layer disposed on the material layer, a second patterned mask layer disposed on the material layer leaning against sidewalls of the first patterned mask layer, and a third patterned mask layer disposed on the material layer leaning against sidewalls of the second patterned mask layer, the first, second and third patterned mask layers formed on the material layer in combination defining a first group of opening having a dimension less than 20 nm.

In another embodiment, a method for forming openings in a material layer includes forming a first patterned mask layer on a material layer disposed on a substrate, forming a second patterned mask layer on the material layer leaning on sidewalls of the first patterned mask layer, forming a third patterned mask layer on the material layer leaning on sidewalls of the second patterned mask layer, and selectively removing the first patterned mask layer to define a first group of openings with a dimension less than 14 nm.

In yet another embodiment, a method for forming nanometer features in a material layer disposed on a substrate includes performing multiple deposition processes on a substrate to form multiple mask layers on a material layer disposed on a substrate, where the multiple mask layer includes N mask layers, wherein N is a positive integer greater than or equals to 2, and selectively etching a portion of the mask layers formed in the multiple mask layer from the substrate to form a first group of openings in between each of the mask layers, wherein the mask layers being removed from the substrate are a (N−1) layer and a (N−(1+2X)) layer, wherein X is an integer less than N.

BRIEF DESCRIPTION OF THE DRAWINGS

So that the manner in which the above recited features of embodiments of the present invention can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3G schematically illustrate one example of cross sectional views of a sequence for forming a nanostructure as an mask layer during the manufacturing process.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for manufacturing nanostructures with desired small dimensions, less than 14 nanometers or beyond, are provided. The methods utilize self-aligned multiple spacer patterning (SAMSP) process to transfer features with small dimensions to a mask layer that may be used in an etching process to further transfer features into a material layer disposed underneath the mask layer. The self-aligned multiple spacer patterning (SAMSP) utilizes minimum lithographic exposure process, but rather multiple deposition/etching process to incrementally reduce feature sizes formed in the mask layer along the manufacturing process.

Figure 4:
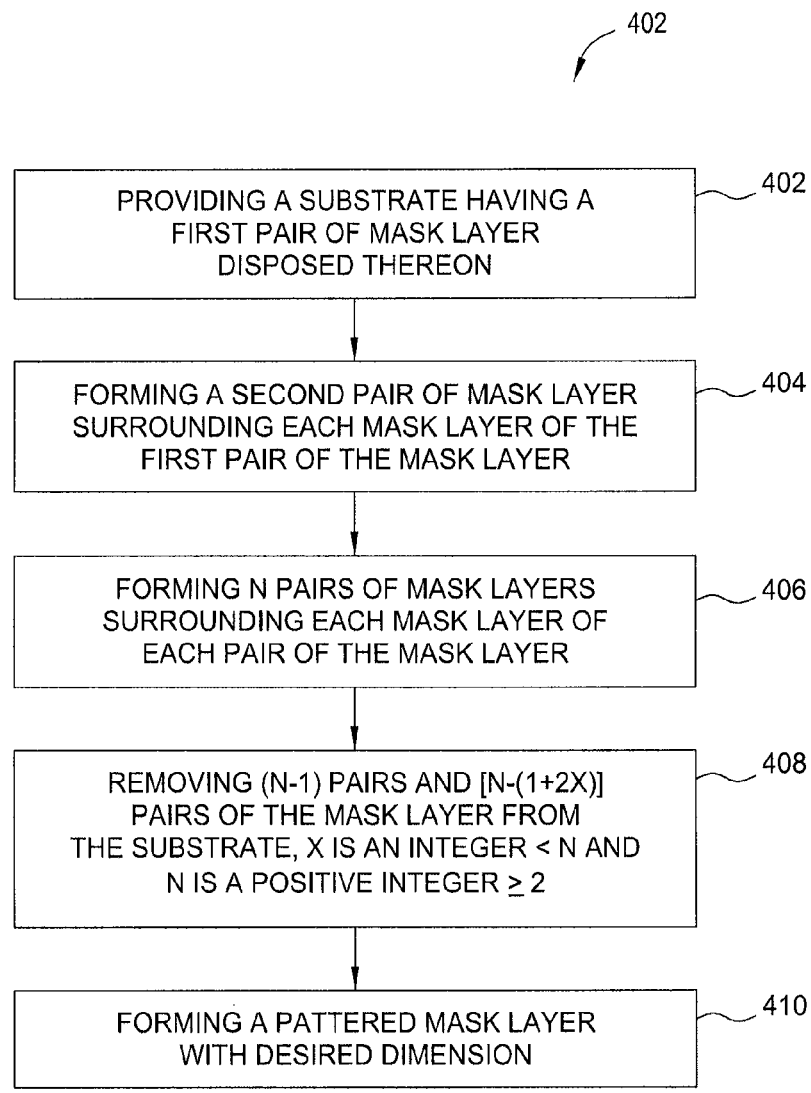
FIG. 4 depicts a flow diagram of a method for performing nanostructures as a mask layer on a semiconductor substrate.

Referring first to FIG. 4, FIG. 4 is a flow diagram of one example of a method 400 for manufacturing a nanostructure in a mask layer that may be later utilized to serve as an etching mask layer to further transfer features into a material layer disposed underneath the mask layer. FIGS. 1A-1E are cross-sectional views of a portion of a base layer 108 with multiple mask layers corresponding to various stages of the method 400. The method 400 may be utilized to form the nanostructure in a mask layer. The mask layer may be utilized to form features in a material layer, such as a contact dielectric layer, a gate electrode layer, a gate dielectric layer, a STI insulating layer, inter-metal layer (IML), or any suitable layers. Alternatively, the method 400 may be beneficially utilized to etch any other types of structures as needed.

In the example described in FIGS. 1A-1E, a self-aligned double spacer patterning (SADSP) process is provided that utilizes two cycles of deposition and etching process, but only one lithographic exposure process to complete the process.

The method 400 begins at block 402 by providing a base layer 108 having a first pair of mask layers 106 disposed on a base layer 108. The base layer 108 may later serve as an etching mask to transfer features to a material layer disposed thereunder during an etching process. The material layer (not shown) formed underneath the base layer 108 may have the features formed in the base layer 108 transferred into the material layer. In one embodiment, the material layer may be a dielectric layer utilized to form a contact layer. Suitable examples of the dielectric layer include carbon-containing silicon oxides (SiOC), polymer materials, such as poly- amides, SOG, USG, silicon oxide, silicon nitride, silicon oxynitride, silicon carbide, silicon oxycarbide, or the like.

In one example, the mask layer 106 may be a first type of dielectric layer selected from a group consisting of polysilicon, nanocrystalline silicon, amorphous silicon, silicon oxide, silicon nitride, silicon oxynitride, silicon carbide, silicon oxycarbide, amorphous carbon, titanium nitride, titanium oxide, titanium oxynitride, tantalum nitride, tantalum oxide, tantalum oxynitride, or any other suitable materials. In one particular example, the first type of dielectric layer selected to form the first pair of the mask layer 106 is polysilicon.

After the first pair of mask layers 106 is formed on the base layer 108, a lithography process is then performed followed with an etching/trimming process to form the patterned mask layer 106 with a first dimension 116. The trimmed mask layers 106 as formed on the base layer 108 may have a pitch 104 between about 50 nm and about 150 nm, such as about 99 nm. In this example, only one lithographic exposure process and one etching/trimming process is required to form the patterned first pair of mask layer 106 on the base layer 108, called one lithographic and one etching process (1L1E).

Figure 1A:
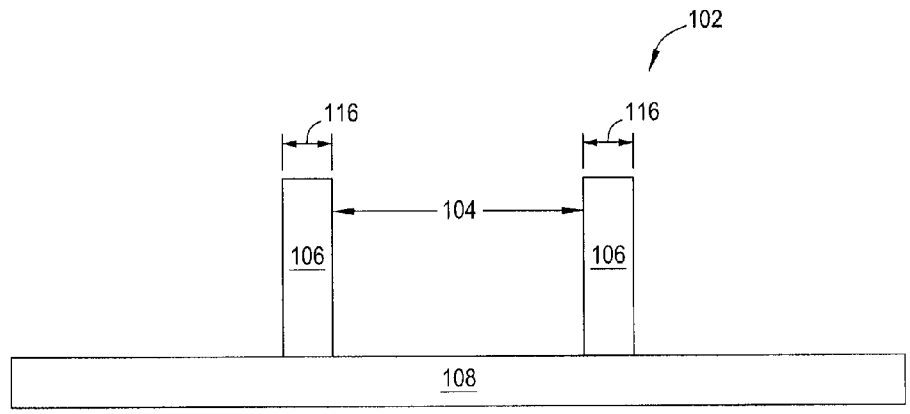
FIGS. 1A-1E schematically illustrate one example of cross sectional views of a sequence for forming a nanostructure as an mask layer during the manufacturing process.
Figure 1B:
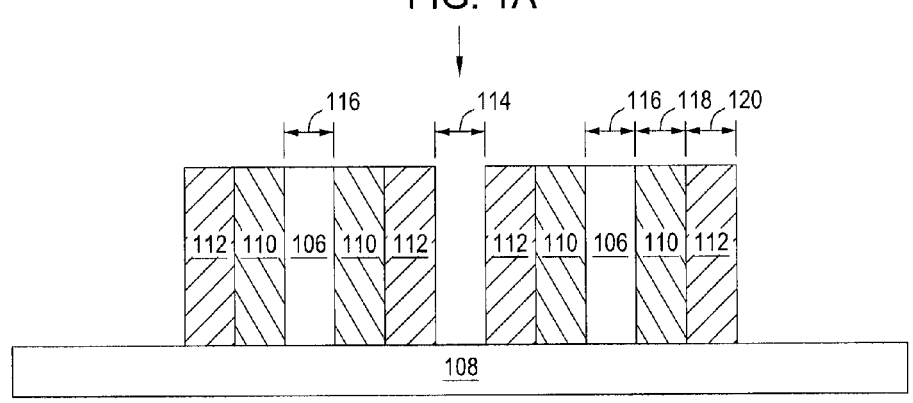

At block 404 to block 406, a second pair of mask layers 110 at block 404 and a third pair of mask layers 112 at block 406 (or all spacers for all mask layers 110, 112) may be consecutively formed on the base layer 108 leaning against sidewalls of the first pair of mask layers 106, as shown in FIG. 1B. It is noted that N pairs of spacers (or mask layers) may be formed as many as needed to continuously shrink the pitch defined between the mask layers 106, 110, 112. N is configured to be a positive integer. In the embodiment depicted in FIG. 1A-1D, N is 3.

The second pair and third pair of the mask layers 110, 112 are formed against the first pair of the mask layers 106 by a suitable deposition process, such as atomic layer deposition (ALD), epitaxial deposition process, physical vapor deposition (PVD), chemical vapor deposition (CVD), plasma enhanced CVD (PECVD), SACVD, and the like. In one example, one particular deposition technique utilized to form the second pair of mask layers 100 and the third pair of mask layers 112 is atomic layer deposition (ALD) process.

When a first ALD process is performed, the second pair of mask layers 110 may be formed across the substrate covering the entire substrate surface. As such, a gentle selective etching process may be performed to selectively remove the second pair of the mask layer 110 formed on the substrate surface, only leaving the second pair of the mask layer 110 vertically leaning against the first pair of the mask layer 106. Similarly, when a second ALD process is performed, the third pair of mask layers 112 may be formed across the substrate covering the entire substrate surface. As such, a gentle selective etching process may be performed to selectively remove the third pair of the mask layer 112 formed on the substrate surface, only leaving the third pair of the mask layer 112 vertically leaning against the first pair of the mask layer 106. The selective etching process is performed to etch away excess mask layers 110, 112 from the base layer 108, only leaving a desired port/ion on the base layer with desired dimensions 118, 120. In one embodiment, the second dimension 118 of the second pair of the mask layer 110 may be configured to be substantially similar to the third dimension 120 of the second pair of the mask layer 112 as well as the original first dimension 116 from the first pair of the mask layer 106.

As such, after two cycles of deposition (ALD) processes and etching processes (or called 2 ALD2E), the original pitch 104, as depicted in FIG. 1A between the first pair of mask layers 106 may be shrunk to a second pitch 114. It is controlled that the pitch 114 remained therebetween has substantially the same width for the first, second and third dimensions 116, 118, 120 defined by the first, second and third pairs of mask layers 106, 110, 112.

In this particular example, the second pair of the mask layer 110 is a silicon nitride layer and the third pair of the mask layer 112 is an amorphous carbon layer.

Figure 1C:
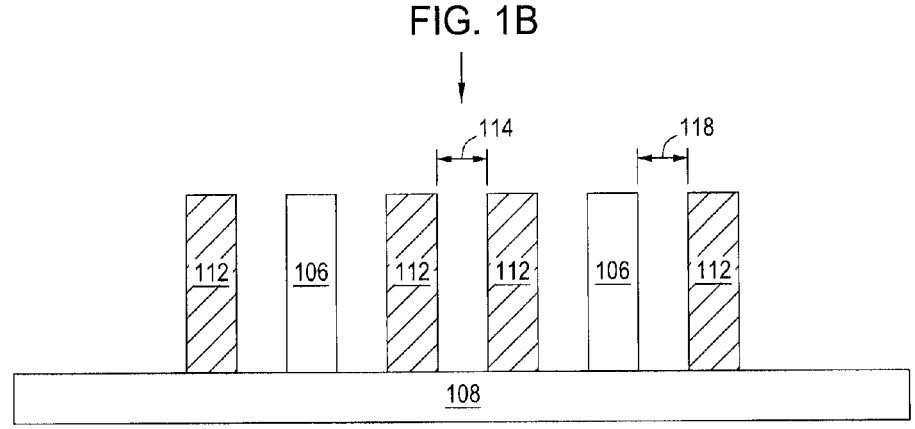

At block 408, an etching process is performed to remove the second pair of the mask layer 110 from the base layer 108, as shown in FIG. 1C. As the pitch 114, the first, second and third dimensions 116, 118, 120 are configured to be substantially the same, the remaining mask layers 112, 106 on the base layer 108 serve as an uniform etching mask during the etching process to etch the base layer 108 through the openings defined between the mask layers 112, 106. This process requires a single etching process (1E) to fulfill the feature transfer to the base layer 108.

In order to generate a general guideline for practice this process, when N pairs of mask layers are formed on a substrate, generally the (N−1) pair and the [N−(1+2X)] pair of the mask layers will be removed, where N is any positive integers greater and/or equals to 2 (N≥2) while X is any positive integers less than N (X<N), as to form a substantially equal spacing between each mask layer. More examples will be discussed below with referenced to FIGS. 2A-2F and FIGS. 3A-3G.

Figure 1D:
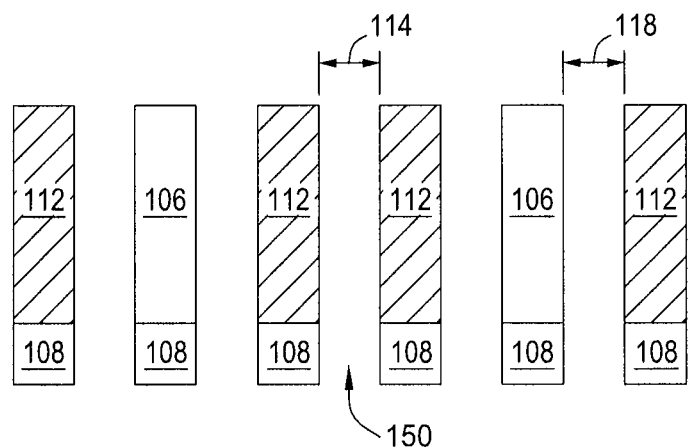
Figure 1E:
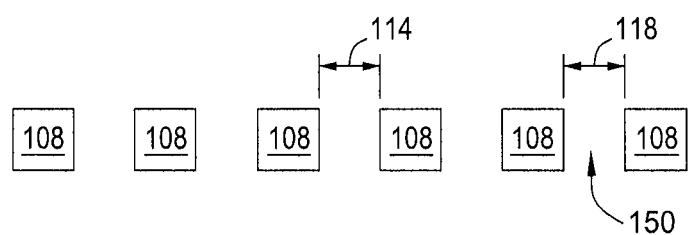

At block 410, after the etching process, openings 150 are formed in the base layer 108, as shown in FIG. 1D. The openings 150 formed in the mask layer 150 are substantially similar to the dimensions 114, 118 defined between the mask layers 112, 106. After the feature is transferred to the base layer 108 forming the opening 150 with the dimension 118, the remaining mask layers 106, 112 on the base layer 108 may then be removed, as shown in FIG. 1E, by another etching process (1E). In one example, the resultant dimension formed in the openings 150 transferred from the dimensions 114, 118 is less than 20 nm, such as about 5 nm and 19 nm, such as about 16 nm.

As such, in the overall process depicted in FIG. 4 with references to FIG. 1A-1E, only one lithographic exposure process is performed (1L at block 402) along with 2 deposition process and with 5 etching steps (e.g., 1E at block 402, 2 ALD and 2 E at block 406, 1E at block 408 and 1E at block 410). By doing so, minimum lithographic exposure process is required to complete the process, so as to eliminate lithographic errors as well as saving manufacturing cost and cycle time.

Figure 2A:
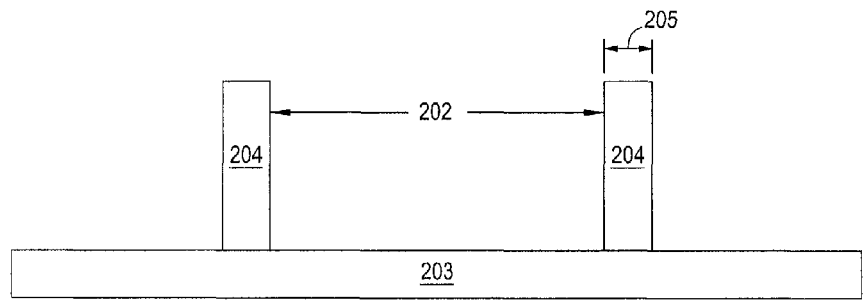
FIGS. 2A-2F schematically illustrate another example of cross sectional views of a sequence for forming a nanostructure as an mask layer during the manufacturing process.

In another example depicted in FIGS. 2A-2F for a self-aligned triple spacer patterning (SATSP) process, similar to the examples depicted in FIGS. 1A-1E, a first pair of mask layers 204 is formed on a base layer 203 defining a pitch 202 therebetween, as shown in FIG. 2A. The pitch 202 may be configured to have a width between about 50 nm and about 150 nm, such as about 60 nm and about 90 nm, for example about 80 nm. The first pair of the mask layer 204 may define a first dimension 205. Similarly, as discussed above, this step may require one lithographic exposure process and one etching/trimming process to form the patterned first pair of mask layer 204 on the base layer 203, called one lithographic and one etching process (1L1E).

Figure 2B:
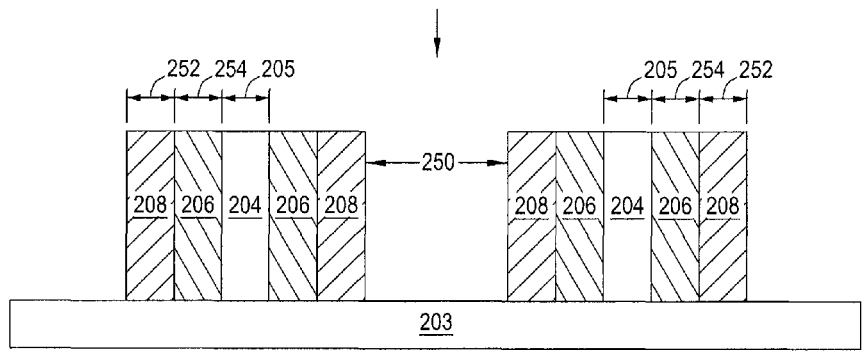

Subsequently, a second pair and a third pair of mask layers 206, 208, similar to the mask layers 110, 112, are formed on the base layer 203, as shown in FIG. 2B. The second and third pair of the mask layers 206, 208 may each define a second dimension 254 and a third dimension 252. The second and the third dimension 254, 252 are configured to have substantially similar width. Similarly, this process may require two cycles of deposition (ALD) processes and etching processes (or called 2 ALD2E) to fulfill.

Figure 2C:
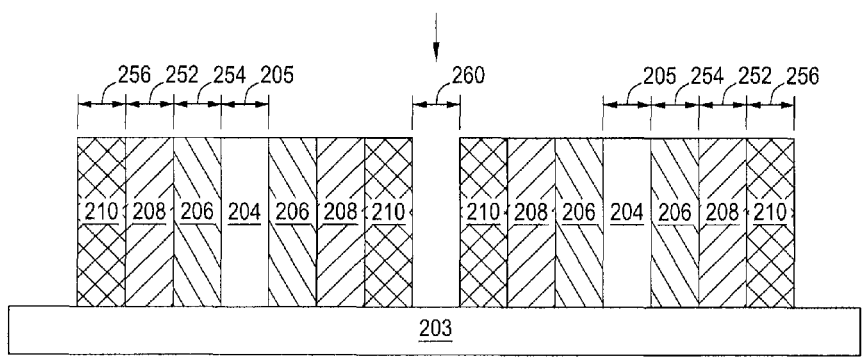

In addition, a third cycle of deposition (ALD) processes and etching processes (or called 1ALD1E, a total of 3ALD and 3E) may be performed to form a fourth pair of mask layers 210 to further reduce the pitch 250 to the narrower pitch 260, as shown in FIG. 2C. By now, the pitch 260 may be shrank to about less than 15 nm, such as about 10 nm. The fourth pair of mask layer 210 may define a fourth dimension 256, similar to the first, second and third dimension 205, 254, 252 defined by other mask layers 204, 206, 208.

Figure 2D:
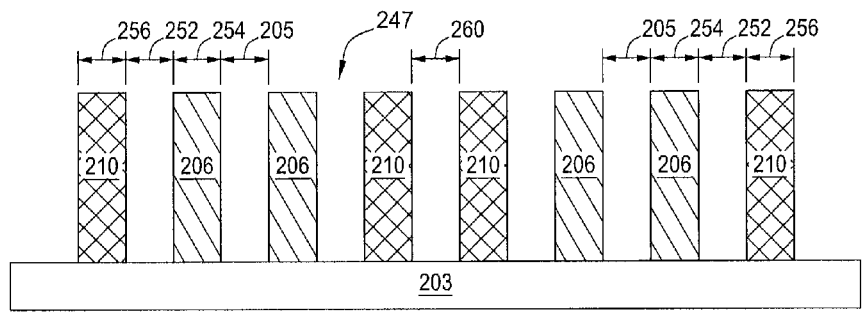

As the pitch 260 and the dimensions 205, 254, 252, 256 has all reached down to a desired level, an etching process may be performed to selectively removing a portion of the mask layer, such as the first and the third pairs of the mask layers 204, 208, as shown in FIG. 2D, creating openings 247 with equal widths 252, 205 among the mask layers 206, 210 remained on the base layer 203. An additional etching process is required to selectively remove the first pair of the mask layers 204 and the third pair of the mask layers 208 from the base layer 203. (1L)

In applying the formula above depicted in block 408, when N pairs of mask layers are formed (N is 4 in this example of FIG. 2C), (N−1) pair, (e.g., 4−1=3, the third pair of mask layers), and [N−(1+2X)] pair, (e.g., 4−(1+2×1)=1, the first pair of mask layer, where X could be 0 or 1) of mask layers are removed. As such in this example, the first pair of the mask layers 204 and the third pair of the mask layers 208 may be removed, as shown in FIG. 2D.

Figure 2E:
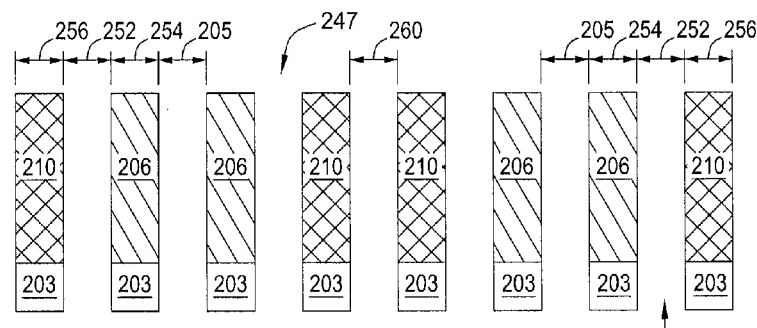
Figure 2F:
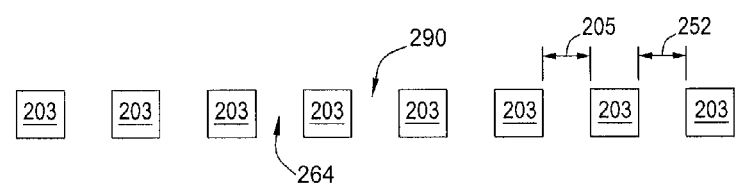

After the opening 247 is defined, a final etching stop is performed to etch the base layer 206 to form openings 290 in the base layer 203, as shown in FIG. 2E. (1E) Subsequently, the remaining mask layers 206, 210 is then removed, leaving the base layer 203 with openings 264 with dimensions 205, 252 as an etch mask for later etching process, as shown in FIG. 2F.

As such, in the overall process depicted in FIG. 2A-2F for a self-aligned triple spacer patterning (SATSP) process, it requires only one lithographic exposure process is performed (1L) along with 3 deposition process and with 6 etching steps (3ALD6E) to complete the process. Similarly, by doing so, minimum lithographic exposure process is required to complete the process, so as to eliminate lithographic errors as well as saving manufacturing cost and cycle time. With more numbers of the spacer utilized to perform the patterning process, the resultant dimension may be incrementally pushed to even smaller. The final dimension 252, 205 as formed in the base layer 203 is about 10 nm.

In a final example described in FIGS. 3A-3G for a self-aligned quadruple spacer patterning (SAQSP) process, similar to the examples depicted in FIGS. 1A-1E and 2A-2F, a first pair of mask layers 304 is formed on a base layer 303 defining a pitch 302 therebetween, as shown in FIG. 3A. The pitch 302 may be configured to have a width between about 50 nm and about 150 nm, such as about 60 nm and about 90 nm, for example about 80 nm. The first pair of the mask layer 304 may define a first dimension 305. Similarly, as discussed above, this step may require one lithographic exposure process and one etching/trimming process to form the patterned first pair of mask layer 304 on the base layer 303, called one lithographic and one etching process (1L1E).

Subsequently, second pair and a third pair of mask layers 306, 308 are formed on the base layer 303, as shown in FIG.

3B. The second and third pair of the mask layers 306, 308 may each define a second dimension 354 and a third dimension 352. The second and the third dimension 354, 352 are configured to have substantially similar width. Similarly, this process may require two cycles of deposition (ALD) processes and etching processes (or called 2 ALD2E) to fulfill.

In addition, a third cycle of deposition (ALD) processes and etching processes (or called 1ALD1E, a total of 3ALD and 3E) may be performed to form a fourth pair of mask layers 310 to further reduced the pitch 350 to the narrower pitch 360, as shown in FIG. 3C. By now, the pitch 360 may be shrunk to about less than 15 nm, such as about 10 nm. The fourth pair of mask layers 310 may define a fourth dimension 356, similar to the first, second and third dimension 305, 354, 352 defined by other mask layers 304, 306, 308.

Furthermore, a fourth cycle of deposition (ALD) processes and etching processes (or called 1ALD1E, a total of 4ALD and 4E) may be performed to form a fifth pair of mask layers 312 to further reduced the pitch 360 to the narrower pitch 362, as shown in FIG. 3D. By now, the pitch 362 may be shrunk to about less than 10 nm, such as about 8 nm. The fifth pair of mask layers 312 may define a fifth dimension 358, similar to the first, second, third and fourth dimension 305, 354, 352, 356 defined by other mask layers 304, 306, 308, 310.

As the pitch 362 and the dimensions 305, 354, 352, 356, 358 has all reached down to a desired level, an etching process may be performed to selectively removing a portion of the mask layer, such as the second and the fourth pairs of the mask layers 306, 310, as shown in FIG. 3E, creating openings 370 with equal widths 356, 354 among the mask layers 304, 308, 312 remained on the base layer 303. An additional etching process is required to selectively remove the second pair of the mask layers 306 and the fourth pair of the mask layers 310 from the base layer 303. (1L)

In applying the formula above depicted in block 408, when N pairs of mask layers are formed (N is 5 in this example of FIG. 3D), (N−1) pair, (e.g., 5−1=4, the fourth pair of mask layers), and [N−(1+2X)] pair (e.g., 5−(1+2×1) =2, the first pair of mask layer, where X could be 0 or 1 but not greater than 2 as it may result in the total resultant number in negative) of mask layers are removed. As such in this example, the second pair of the mask layers 306 and the fourth pair of the mask layers 310 may be removed, as shown in FIG. 3E.

After the opening 370 is defined, a final etching stop is performed to etch the base layer 303 to form openings 370 in the base layer 303, as shown in FIG. 3F (1E). Subsequently, the remaining mask layers 304, 308, 312 are then removed, leaving the base layer 303 with openings 370 with dimensions 354, 356 as an etch mask for later etching process, as shown in FIG. 3G.

As such, in the overall process depicted in FIG. 3A-3G for a self-aligned quadruple spacer patterning (SADSP) process, it requires only one lithographic exposure process is performed (1L) along with 4 deposition process and with 7 etching steps (4ALD7E) to complete the process. Similarly, by doing so, minimum lithographic exposure process is required to complete the process, so as to eliminate lithographic errors as well as saving manufacturing cost and cycle time. With more numbers of the spacer utilized to perform the patterning process, the resultant dimension may be incrementally pushed to even smaller. The final dimension 354, 356 as formed in the base layer 303 is about 8 nm.

Thus, methods for self-aligned multiple spacer patterning (SAMSP) process to transfer features with small dimensions to a mask layer are provided. The self-aligned multiple spacer patterning (SAMSP) process utilizes minimum lithographic exposure process, but rather multiple deposition/ etching process to incrementally reduce feature sizes formed in the mask along the manufacturing process, until a desired extreme small dimension nanostructures are formed in a mask layer.

While the foregoing is directed to embodiments of the present invention, other and further embodiments of the invention may be devised without departing from the basic scope thereof, and the scope thereof is determined by the claims that follow.

What is claimed is:

1. A method for forming nanometer features in a material layer disposed on a substrate comprising:
performing multiple deposition processes on a substrate to form multiple mask layers on a material layer disposed on the substrate, where the multiple mask layer includes N mask layers, wherein N is a positive integer greater than or equal to 2, wherein each mask layer has substantially the same width; and
selectively etching a portion of the mask layers of the multiple mask layers from the substrate to form a first group of openings in between each of the mask layers, wherein the mask layers being removed from the substrate are a (N−1) layer and a (N−(1+2X)) layer, wherein X is an integer less than N, wherein the first group of openings has a dimension less than 14 nm.

2. The method of claim 1, wherein the multiple mask layers are fabricated from dielectric materials.

3. The method of claim 1, wherein at least two mask layers of the multiple mask layers are fabricated from different materials.

4. The method of claim 1, further comprising:
performing an etching process to etching the material layer through the first group of openings defined in the multiple mask layers to form a second group of openings in the material layer.

5. The method of claim 1, wherein selectively etching a portion of the mask layers further comprises:
performing more than one etching process to remove different mask layers of the multiple mask layers.

6. The method of claim 1, wherein a first patterned mask layer of the multiple mask layers is a polysilicon or amorphous silicon layer.

7. The method of claim 6, wherein a second patterned mask layer of the multiple mask layers is silicon nitride and a third patterned mask layer is amorphous carbon.

* * * * *